United States Patent
Dodd

[11] Patent Number: 6,133,571
[45] Date of Patent: Oct. 17, 2000

[54] RESONANT CAVITY FIELD ENHANCING BOUNDARY

[75] Inventor: Mark A. Dodd, Dallas, Tex.

[73] Assignee: Lockheed Martin Corporation, Bethesda, Md.

[21] Appl. No.: 09/299,711

[22] Filed: Apr. 26, 1999

[51] Int. Cl.[7] .................................................... H01L 27/14
[52] U.S. Cl. ........................................ 250/338.4; 250/332
[58] Field of Search ............................ 250/338.4, 338.1, 250/339.01, 339.02, 339.05, 341.3, 332, 370.08

[56] References Cited

U.S. PATENT DOCUMENTS

| | | |
|---|---|---|
| 5,315,128 | 5/1994 | Hunt et al. . |
| 5,389,797 | 2/1995 | Bryan et al. . |
| 5,455,421 | 10/1995 | Spears . |
| 5,479,018 | 12/1995 | McKee et al. . |
| 5,485,015 | 1/1996 | Choi ........................................... 257/21 |
| 5,539,206 | 7/1996 | Schimert . |
| 5,726,805 | 3/1998 | Kaushik et al. . |
| 5,773,831 | 6/1998 | Brouns ................................ 250/370.08 |
| 5,818,066 | 10/1998 | Duboz . |

OTHER PUBLICATIONS

"Resonant wavelength selective photodetectors". T. Wipiejewski, K. Panzlaff, K.J. Ebeling, *Microelectronic Engineering*, 0167–9317/92, 1992, pp. 223–229, Elsevier Science Publishers B.V.

"Resonant–cavity–enhanced pin photodetector with 17GHz bandwidth–efficiency product". C.C. Barron, C. J. Mahon, B. J. Thibeault, G. Wang, W. Jiang, L.A. Coldren and J.E. Bowers, *Electronics Letters,* vol. 20, No. 21, Oct. 13, 1994, p. 1797, Publisher: The Institution of Electrical Engineers.

*Primary Examiner*—Constantine Hannaher
*Assistant Examiner*—Albert Gagliardi
*Attorney, Agent, or Firm*—Sidley & Austin; Stephen S. Sadacca

[57] ABSTRACT

An electromagnetic sensor includes top and bottom longitudinal contacts on opposite surfaces of an electromagnetic absorbing structure. A grating is provided to diffract the electromagnetic radiation. A reflector operating in conjunction with the grating creates an electromagnetic cavity leading to the formation of a standing electromagnetic wave at a resonant frequency within the electromagnetic absorbing material. The addition of a highly electrically conductive layer to the perimeter of the electromagnetic absorbing material further defines the electromagnetic cavity. In particular, the conductive layer serves to create boundary conditions which enhance the absorption of electromagnetic radiation. Such a design applies to a class of electromagnetic sensors known as quantum well infrared photodetectors (QWIPs).

40 Claims, 5 Drawing Sheets

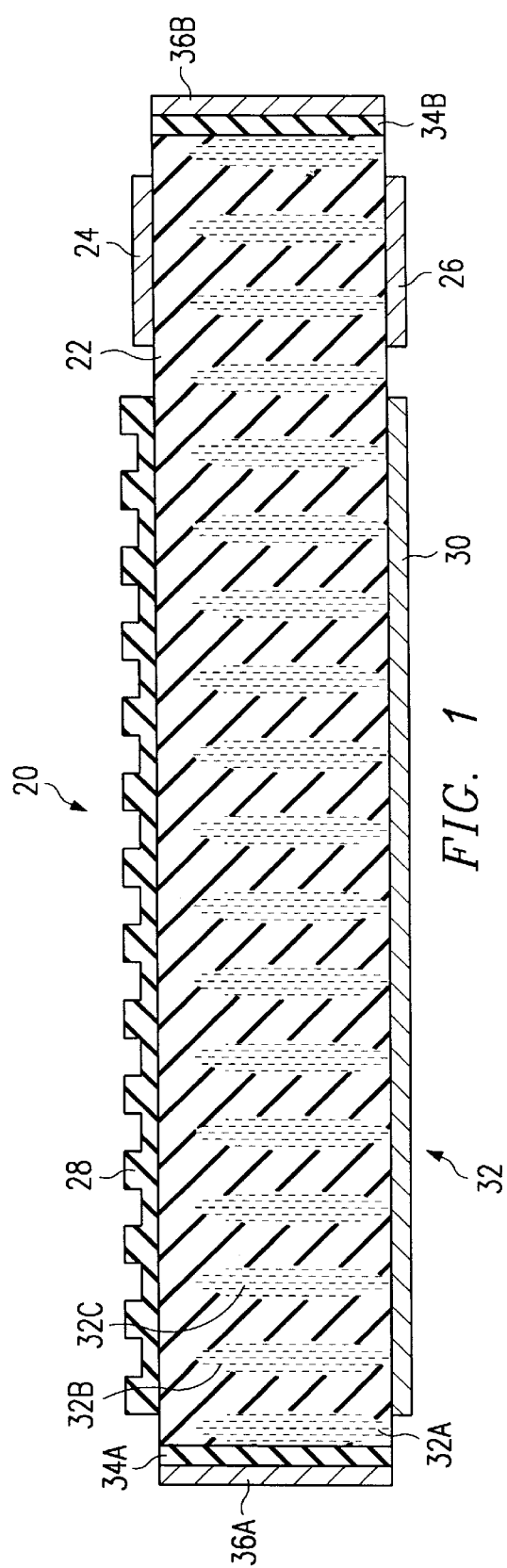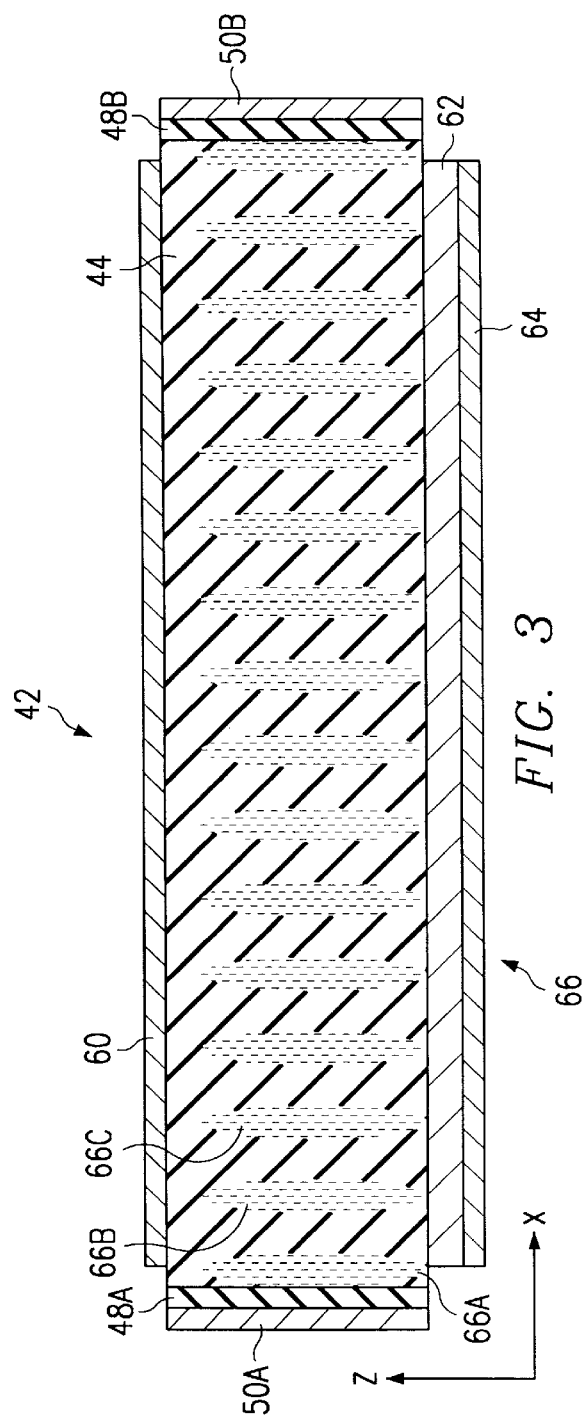

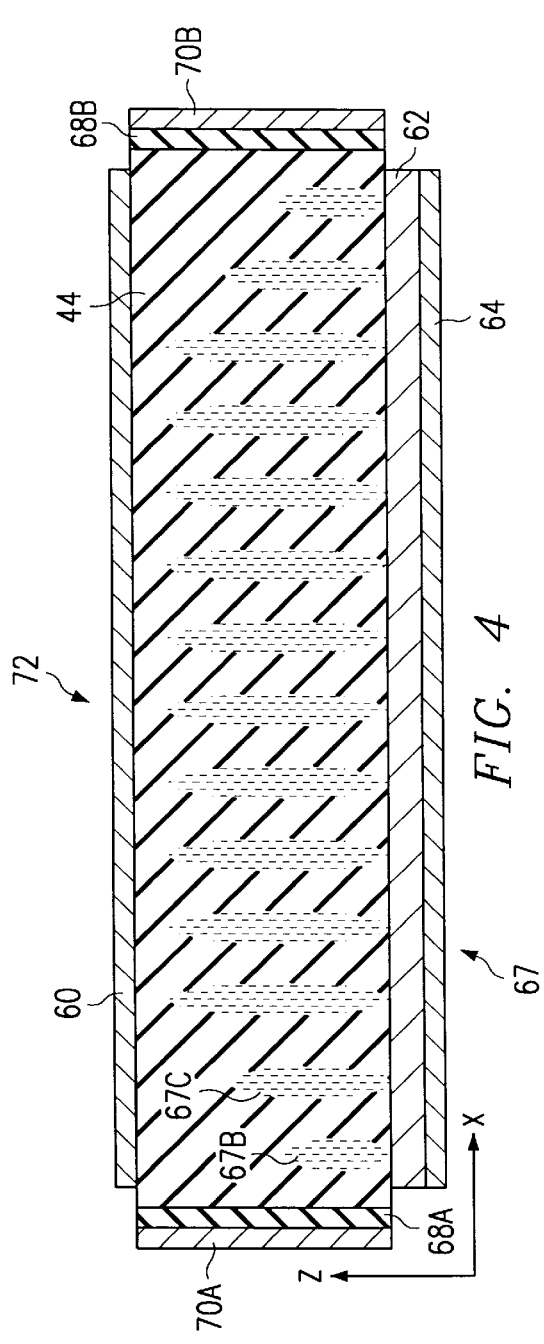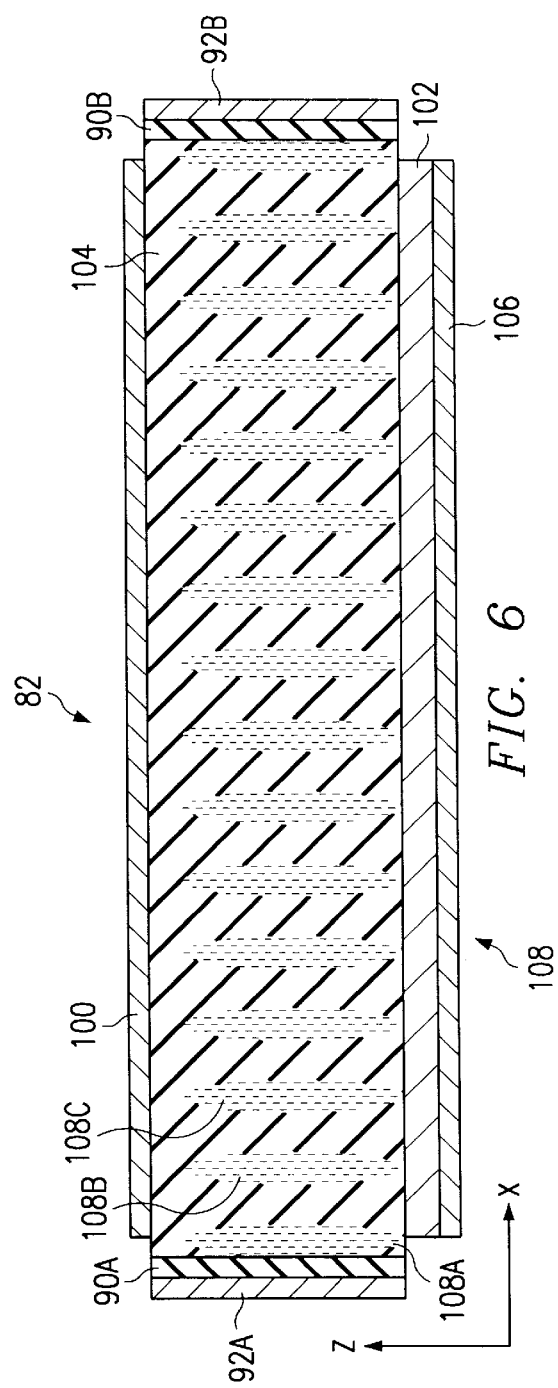

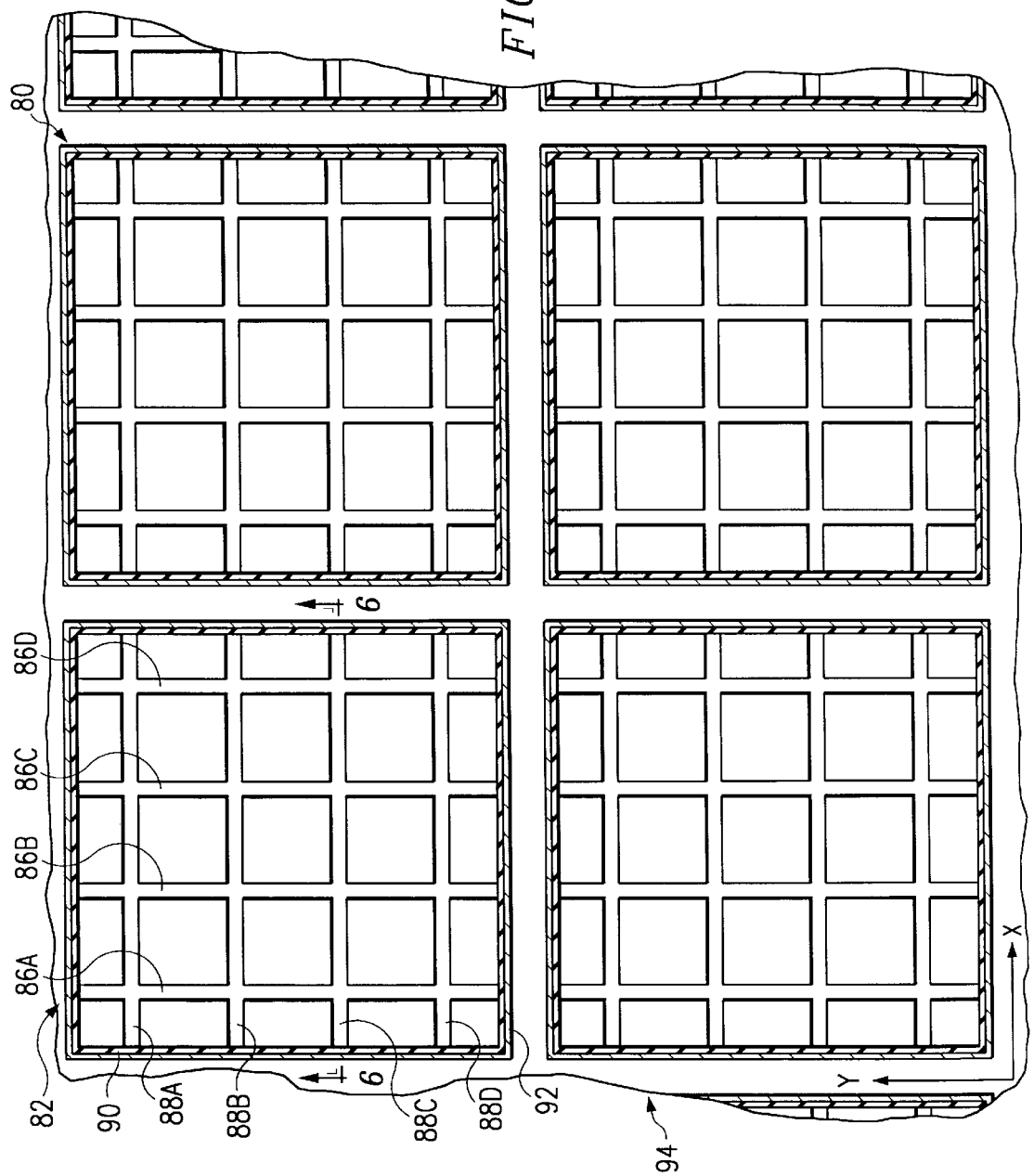

RESONANT CAVITY FIELD ENHANCING BOUNDARY

TECHNICAL FIELD OF THE INVENTION

The present invention pertains in general to electromagnetic sensors and in particular to such sensors which operate in the infrared, visible, and ultraviolet portion of the electromagnetic spectrum and employ resonant cavities.

BACKGROUND OF THE INVENTION

In the field of electromagnetic sensing, certain sensing structures place strict requirements on the polarization of the electromagnetic radiation for absorption by the structure. To meet these requirements, a diffraction grating is used to convert the electromagnetic radiation into a polarization or mode which is absorbed by the sensing structure. The inclusion of a reflector in the sensor creates an electromagnetic cavity. When the incident radiation is at a frequency which resonates within the cavity, a standing wave results, creating regions of high and low electric field intensities. The magnitude of the detection signal is proportional to the number and magnitude of the high intensity field regions. The boundary conditions within the electromagnetic cavity have a significant impact on the magnitude of the detection signal. Improper boundary conditions cause the electromagnetic field to interfere destructively with itself, diminishing the number and magnitude of high field regions, especially near the periphery of the sensing structure.

One such electromagnetic sensor is the quantum well infrared photodetector (QWIP). With current objectives to develop large area focal plane array (FPA) technology for mid wave-length infrared radiation (MWIR), long wavelength infrared radiation (LWIR), and multi-spectral applications at low cost with high performance, QWIP technology is being extensively explored. QWIP technology suffers some performance disadvantage relative to other infrared (IR) technologies. In view of the more mature material and processing technology utilized with QWIP FPAs relative to other IR technologies, there exists a need for design improvements to enhance quantum efficiency (QE) and therefore performance.

SUMMARY OF THE INVENTION

A selected embodiment of the present invention is an electromagnetic radiation sensor, in which incident radiation is diffracted. The sensor includes an electromagnetic radiation absorbing structure for absorbing the diffracted radiation. A resonant cavity for the radiation is formed with the absorbing structure positioned within the cavity. A reflector for the radiation defines one surface of the cavity. Electrical conductors are formed contacting the absorbing structure for carrying a detection signal produced by the absorbing structure in response to the diffracted radiation. In addition, a conductive layer encompasses the periphery of the cavity to provide an electric field boundary for the radiation within the cavity.

In further aspects of the present invention, the electromagnetic radiation sensor includes a multiple quantum well (MQW) infrared (IR) absorbing structure as the electromagnetic radiation absorbing structure. The sensor then forms a quantum well IR photodetector (QWIP). Alternatively, the photodetector has multiple elongate MQW IR radiation absorbing structures forming the diffraction grating.

BRIEF DESCRIPTION OF THE DRAWINGS

For a more complete understanding of the present invention and the advantages thereof, reference is now made to the following description taken in conjunction with the accompanying drawings in which:

FIG. 1 is a section view of an electromagnetic sensor in accordance with the present invention showing high electric field regions within the sensor, FIG. 3 is a section view of one photodetector shown in FIG. 2 illustrating proper placement of an electrically insulating and an electrically conducting layer on the perimeter of the photodetector in accordance with the present invention, FIG. 4 is a section view of a QWIP photodetector showing improper placement of the insulating and conducting layers on the perimeter of the photodetector, FIG. 5 is a plan view of a portion of an IR FPA comprised of enhanced QWIP (EQWIP) photodetectors showing multiple elongate MQW IR absorbing structures creating an optical diffraction grating in each photodetector, FIG. 6 is a section view of one photodetector shown in FIG. 5 illustrating proper placement of the electrically insulating and electrically conducting layers on the perimeter of the EQWIP photodetector in accordance with the present invention.

DETAILED DESCRIPTION

Figure 2:
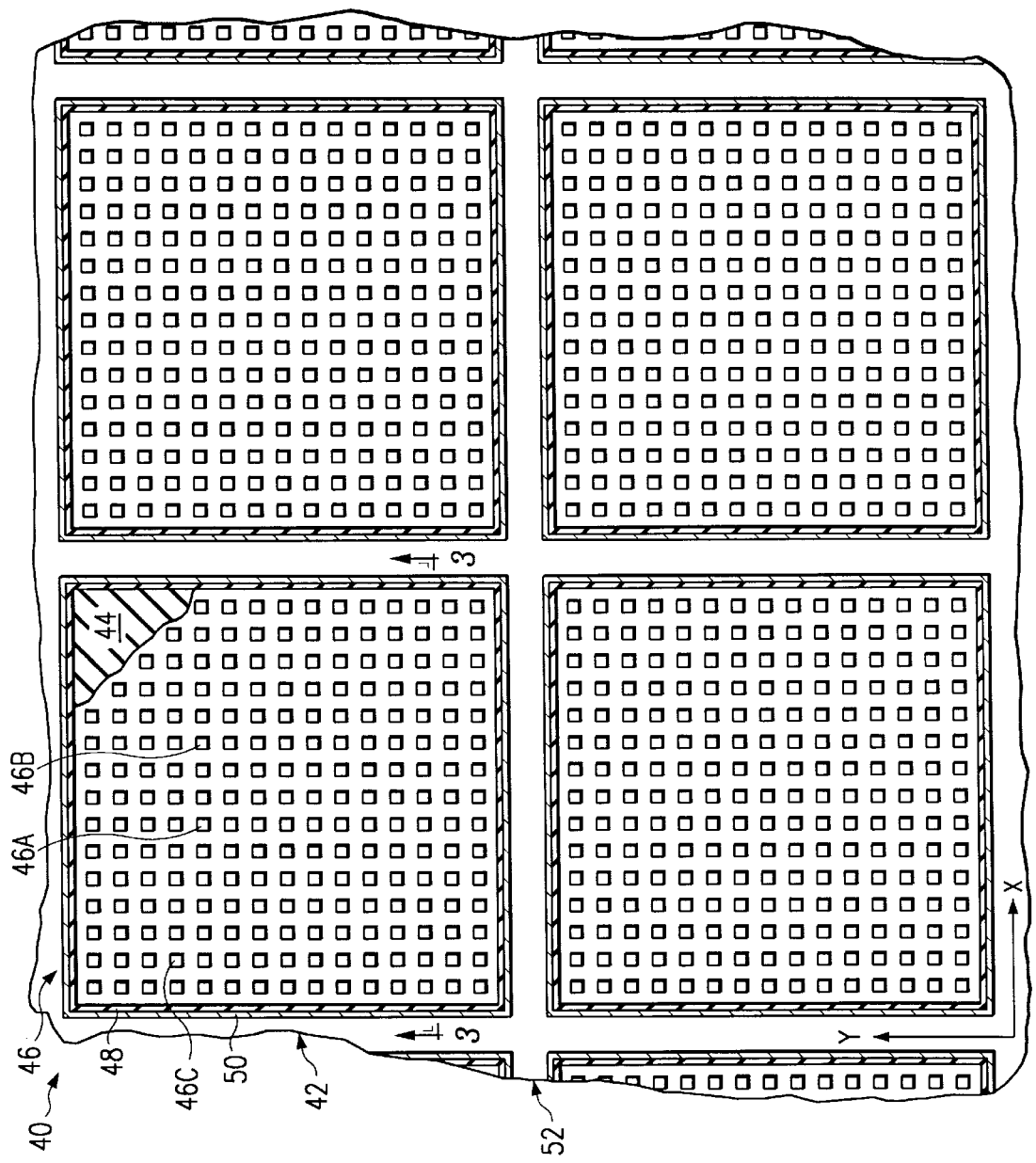
FIG. 2 is a plan view of a portion of an infrared (IR) focal plane array (FPA) comprised of quantum well infrared photodetectors (QWIPs) showing an optical diffraction grating in conjunction with a single multiple quantum well (MQW) IR absorbing structure in each photodetector.

The present invention is utilized in conjunction with electromagnetic sensors which create a standing electromagnetic wave within a sensing structure. This standing wave is created by a diffraction grating. The invention is used to control boundary conditions which impact sensor performance. Creation of the correct boundary conditions causes the standing wave to interfere constructively with itself The creation of incorrect boundary conditions causes the standing wave to interfere destructively with itself As electromagnetic sensors respond to both the magnitude and number of high electric field regions within the standing wave, sensor response is increased by appropriate boundary conditions.

FIG. 1 is a sectional view of an electromagnetic sensor 20 in accordance with the present invention. The electromagnetic sensor 20 includes an electromagnetic absorbing structure 22, which is, for example, a multiple quantum well (MQW) infrared (IR) absorber structure having a thickness of 2.8 $\mu$m. A top electrical contact 24 and a bottom electrical contact 26 are placed on either side of the absorbing structure 22. The electrical contacts are preferably made of a highly doped semiconductor material such as n+ GaAs having a thickness of 0.5 $\mu$m. A diffraction grating 28 is formed on the absorbing structure 22. The diffraction grating is preferably made of a semiconductor material such as undoped GaAs, 1.0 $\mu$m thick, and having a period of 3.0 $\mu$m. A reflector 30, composed of a highly conductive material such as gold, having a thickness of 2000 Å, is placed on the absorbing structure 22 opposite the diffraction grating 28. The diffraction grating 28, the absorbing structure 22, and the reflector 30 form an electromagnetic resonant cavity. When electromagnetic radiation of the correct wavelength, approximately 9.0 $\mu$m in this example, is incident upon sensor 20, a standing wave electric field 32, including specific high field regions 32A, 32B, and 32C, is created within the absorbing structure.

Electrically insulating layers 34A and 34B are formed as part of an insulating layer that extends around the perimeter of the electromagnetic absorbing structure 22. The insulating layer is preferably made of silicon dioxide ($SiO_2$) and has a thickness of 1000 Å. Highly electrically conducting layers 36A and 36B are formed as part of a conducting layer on the outer surface of the insulating layer which includes layers 34A and 34B. The conducting layer is, for example, composed of gold having a thickness of 2000 Å. The placement of conducting layers 36A and 36B is critical to the performance of the electromagnetic sensor 20. FIG. 1 shows placement of conducting layers 36A and 36B such that the standing wave electric field 32 interferes constructively with itself resulting in high field regions 32A, 32B, and 32C extending to the perimeter of the sensor 20. The optimum placement of the conducting layers 36A and 36B is at a minimum in the standing electric field 32.

While a number of electromagnetic sensors exist which use standing electromagnetic waves, the present invention readily lends itself to quantum well infrared photodetectors (QWIPs). QWIP photodetectors operate by absorbing IR radiation and creating excited electrical carriers. Due to quantum mechanical selection rules, the IR radiation must have a component of its electric field normal to the plane of the quantum well for absorption to occur. Because the axis of most IR imaging systems are typically normal to the surface of the photodetector, the electric field has virtually no component normal to the plane of the quantum well. This results in negligible absorption and photoresponse. A diffraction grating designed to operate at the appropriate IR wavelength diffracts the radiation so that it has a significant normal component to its electric field. Thus, diffraction gratings, and the standing waves they create, have allowed dramatic improvement in QWIP device performance. Designs for diffraction grating coupled QWIPs are found in "Quantum Well Infrared Photodetectors," J. Appl. Phys. 74 (8), Oct. 15, 1993, by Barry F. Levine.

FIG. 2 shows a portion of a focal plane array (FPA) 40 fabricated using grating coupled QWIP design methodologies. A diffraction grating coupled QWIP photodetector 42 receives incident IR radiation normal to the plane of the Figure. The incident radiation is absorbed by a MQW IR absorber structure 44. The incident radiation is diffracted by a grating 46, with elements 46A, 46B, and 46C being but a few of the many optically diffracting centers. Elements 46A, 46B, and 46C have a size of 1.5 μm on a side and an element periodicity of 3.0 μm for operation in the LWIR. The diffraction grating 46 is required for the QWIP photodetector 42 due to the quantum mechanical selection rules mentioned previously.

An electrically insulating layer 48 is formed around the perimeter of the photodetector 42. A highly electrically conducting layer 50 is placed opposite the MQW IR absorber structure 44 on the insulating layer 48. Layers 48 and 50 allow the boundary conditions to be controlled, thereby directly impacting device performance.

The electrically insulating layer 48 is composed of, for example, silicon dioxide ($SiO_2$) or silicon nitride ($Si_3N_4$) with a thickness of 1000 Å. The highly electrically conducting layer 50 is composed of any of the standard metals used in semiconductor fabrication, but preferably of gold (Au) with a thickness of 2000 Å.

The QWIP FPA 40 is formed on a suitable substrate 52. This substrate is preferably composed of undoped GaAs with a thickness of 600 μm.

The QWIP photodetector 42, a high impedance photoconductive device, shown in sectional view FIG. 3, operates as follows: An external electrical bias is placed across the device 42 via a top contact 60 and a bottom contact 62. These contacts are placed on either side of the MQW IR absorber structure 44. Infrared radiation is absorbed creating excited electrical carriers which are swept out of the device via the externally applied bias. The result is a change in device impedance indicating the presence of absorbed IR radiation. One material design for the MQW structure 44, the top contact 60, and the bottom contact 62 is presented in Table 1 below.

TABLE 1

QWIP MATERIAL DESIGN

| PARAMETER | UNITS | VALUE |
|---|---|---|
| Top Contact | | |
| Thickness | Å | 5,000 |
| Doping (n-type) | $cm^{-3}$ | $2 \times 10^{18}$ |
| MQW IR Absorber Structure | | |
| GaAs Well | | |
| Thickness | Å | 45 |
| Doping (n-type) | $cm^{-3}$ | $7 \times 10^{17}$ |
| Number of Wells | | 50 |
| $Al_XGa_{1-X}As$ Barrier | | |
| X-Value | Mole Fraction | 0.27 |
| Thickness | Å | 500 |
| Doping (n-type) | $cm^{-3}$ | Undoped |
| Number of Barriers | | 51 |
| Bottom Contact | | |
| Thickness | Å | 12,000 |
| Doping (n-type) | $cm^{-3}$ | $1 \times 10^{18}$ |

The QWIP diffraction grating 46 is formed by etching a diffraction pattern for the appropriate IR wavelength into the bottom contact layer 62. Diffraction grating 46 is subsequently metallized to create a three dimensional reflector 64. This process creates a reflective diffraction grating. Alternatively, the diffraction grating is etched into the top contact 60 creating a transmissive diffraction grating. The bottom contact 62 is metallized forming a planar reflector 64 in the transmissive grating case. The material design of Table 1 is used in the reflective diffraction grating design with the grating having a period of 3.0 μm etched to a depth of 0.75 μm into the bottom contact for operation in the long wavelength infrared (LWIR).

In both the reflective and transmissive grating cases, IR radiation impinging upon the photodetector 42 and diffracted by the grating 46, creates a standing wave electric field 66 in the MQW IR absorber structure 44 as shown in FIG. 3. Regions 66A, 66B, and 66C are just a few of the high field regions created by the standing electric field 66.

Quantum efficiency (QE) is defined as the percent of incident IR photons converted to excited electrical carriers. In QWIP photodetectors, the QE is determined by the magnitude of the standing wave electric field 66 in the direction normal to the plane of the quantum wells, corresponding to the Z direction in FIG. 3. A majority of the electric field in high field regions 66A, 66B, and 66C is polarized in the Z direction, the correct mode for absorption by MQW IR absorber structure 44. The QE is further determined by the number of high electric field regions within the device. Maximizing QWIP photoresponse therefore requires maximizing both the magnitude and number of high field regions within the device. One variable in this optimization process is the boundary conditions imposed by the detector cavity.

Electrically insulating layers 48A and 48B, corresponding to layer 48 in FIG. 2, are located on the perimeter of photodetector 42. Highly electrically conducting layers 50A and 50B, corresponding to layer 50 in FIG. 2, are opposite the MQW IR absorber structure 44 on the insulating layers 48A and 48B. The insulating layers 48A and 48B and the conducting layers 50A and 50B are used to create the appropriate boundary conditions. The present invention maximizes the number of high field regions, such as 66A, 66B, and 66C, by minimizing the effect of the edge of the photodetector. These boundary conditions have a significant impact on device performance, especially for small devices where the number of high field regions is relatively small. Fifteen such regions are shown in FIG. 3.

FIG. 3 shows the highly conducting layers 50A and 50B placed at minimums in the standing wave electric field 66 if the standing electric field 66 extended periodically beyond the edge of the device. The conducting layers 50A and 50B act as reflectors and serve to constructively reinforce the standing electric field 66 created by the diffraction grating 44 and the reflector 64. Correct placement of insulating layers 48A and 48B and conducting layers 50A and 50B results in enhanced QE and sensitivity due to maximizing the magnitude and number of high field regions in the standing electric field 66.

Placement of highly conducting layers 70A and 70B at a maximum in a standing wave electric field 67 is shown in sectional view FIG. 4 of a QWIP photodetector 72. Insulating layers 68A and 68B are provided on the interior of the conducting layers 70A and 70B. Since the highly conducting layers 70A and 70B do not support electric fields with large field components tangential to the conducting layers 70A and 70B, the standing electric field 67 is disrupted. The high field regions are significantly reduced as conducting layers 70A and 70B cause standing electric field 67 to destructively interfere with itself at the boundary. No high field regions are seen adjacent to the conducting layers 70A and 70B. High field regions 67B and 67C have reduced magnitude and/or volume relative to their states in standing electric field 66. Improper placement of the insulating layers 68A and 68B and conducting layers 70A and 70B reduces the QE of the QWIP photodetector leading to lower signal currents and decreased sensitivity.

Designs for enhanced QWIPs or EQWIPS are found in U.S. Pat. No. 5,539,206, entitled Enhanced Quantum Well Infrared Photodetector, issued on Jul. 23, 1996, which is hereby incorporated by reference.

FIG. 5 shows a portion of a FPA 80 fabricated using EQWIP design methodologies as disclosed in U.S. Pat. No. 5,539,206. Referring to FIG. 5, an EQWIP photodetector 82 receives incident IR radiation normal to the plane of the Figure. The incident radiation is diffracted by a grating. The diffraction grating is composed of a plurality of MQW IR absorber structures 86A, 86B, 86C, 86D, 88A, 88B, 88C, and 88D. The width of MQW structures 86A, 86B, 86C, 86D, 88A, 88B, 88C, and 88D is nominally 1.2 μm with a structure periodicity of 7.33 μm for operation in the LWIR. The diffraction grating is required due to quantum mechanical selection rules as previously stated. Diffraction gratings of the type used in the EQWIP are quite efficient at converting normally incident radiation into a mode which is absorbed by MQW structures 86A, 86B, 86C, 86D, 88A, 88B, 88C, and 88D.

The perimeter of photodetector 82 comprises an electrically insulating layer 90 and a highly electrically conducting layer 92. The highly conducting layer 92 is placed opposite MQW IR absorbing structures 86A, 86B, 86C, 86D, 88A, 88B, 88C, and 88D on insulating layer 90. Insulating layer 90 is preferably composed of silicon dioxide ($SiO_2$) or silicon nitride ($Si_3N_4$) with a thickness of 1000 Å, while conducting layer 92 is preferably composed of gold with a thickness of 2000 Å. Layers 90 and 92 allow the boundary conditions to be controlled thereby impacting device performance.

The EQWIP FPA 80 is formed on a suitable substrate 94. This substrate is preferably composed of undoped GaAs with a thickness of 600 μm.

The EQWIP photodetector 82, a high impedance photoconductive device, shown in sectional view FIG. 6, operates as follows: An external electrical bias is placed across the device via a top contact 100 and a bottom contact 102. These contacts are placed on either side of a MQW IR absorbing structure 104 corresponding to any of the MQW structures 86A, 86B, 86C, 86D, 88A, 88B, 88C, and 88D of FIG. 5. Radiation is absorbed creating excited electrical carriers which are swept out of the device via the externally applied bias. The resulting change in device impedance indicates the presence of absorbed IR radiation. One material design for the MQW structure 104, the top contact 100, and the bottom contact 102 is presented in Table 2 below.

TABLE 2

EQWIP MATERIAL DESIGN

| PARAMETER | UNITS | VALUE |
| --- | --- | --- |
| Top Contact | | |
| Thickness | Å | 5,000 |
| Doping (n-type) | $cm^{-3}$ | $2 \times 10^{18}$ |
| MQW IR Absorber Structure | | |
| GaAs Well | | |
| Thickness | Å | 45 |
| Doping (n-type) | $cm^{-3}$ | $7 \times 10^{17}$ |
| Number of Wells | | 25 |
| $Al_xGa_{1-x}As$ Barrier | | |
| X-Value | Mole Fraction | 0.27 |
| Thickness | Å | 500 |
| Doping (n-Type) | $cm^{-3}$ | Undoped |
| Number of Barriers | | 26 |
| Bottom Contact | | |
| Thickness | Å | 3,000 |
| Doping (n-type) | $cm^{-3}$ | $1 \times 10^{18}$ |

The EQWIP diffraction grating and a planar reflector 106, placed opposite of the MQW IR absorbing structure 104 on contact layer 102, creates a standing wave electric field 108 as shown in FIG. 6. Regions 108A, 108B, and 108C are just a few of the high field regions created by standing electric field 108. As with the QWIP, a majority of the electric field in these high field regions 108A, 108B, and 108C is polarized in the Z direction, the correct mode for absorption by the MQW structure 104.

The perimeter of photodetector 82 comprises electrically insulating layers 90A and 90B corresponding to layer 90 in FIG. 5, and highly electrically conducting layers 92A and 92B corresponding to layer 92 in FIG. 5. The electrically conducting layers 92A and 92B are opposite MQW IR absorbing structure 104 on insulating layers 90A and 90B.

The combination of insulating layers 90A and 90B and conducting layers 92A and 92B are used to control the boundary conditions for the standing electric field 108.

As shown in FIG. 6, the highly conducting layers 92A and 92B are placed at minimums of standing wave electric field 108 if the standing electric field 108 extended periodically beyond the edge of the device. The highly conducting layers 92A and 92B act as reflectors and serve to reinforce the standing electric field 108 created by the diffraction grating 84 and planar reflector 106. Correct placement of insulating layers 90A and 90B and conducting layers 92A and 92B results in enhanced QE and sensitivity due to the reinforced standing electric field 108.

Figure 7:
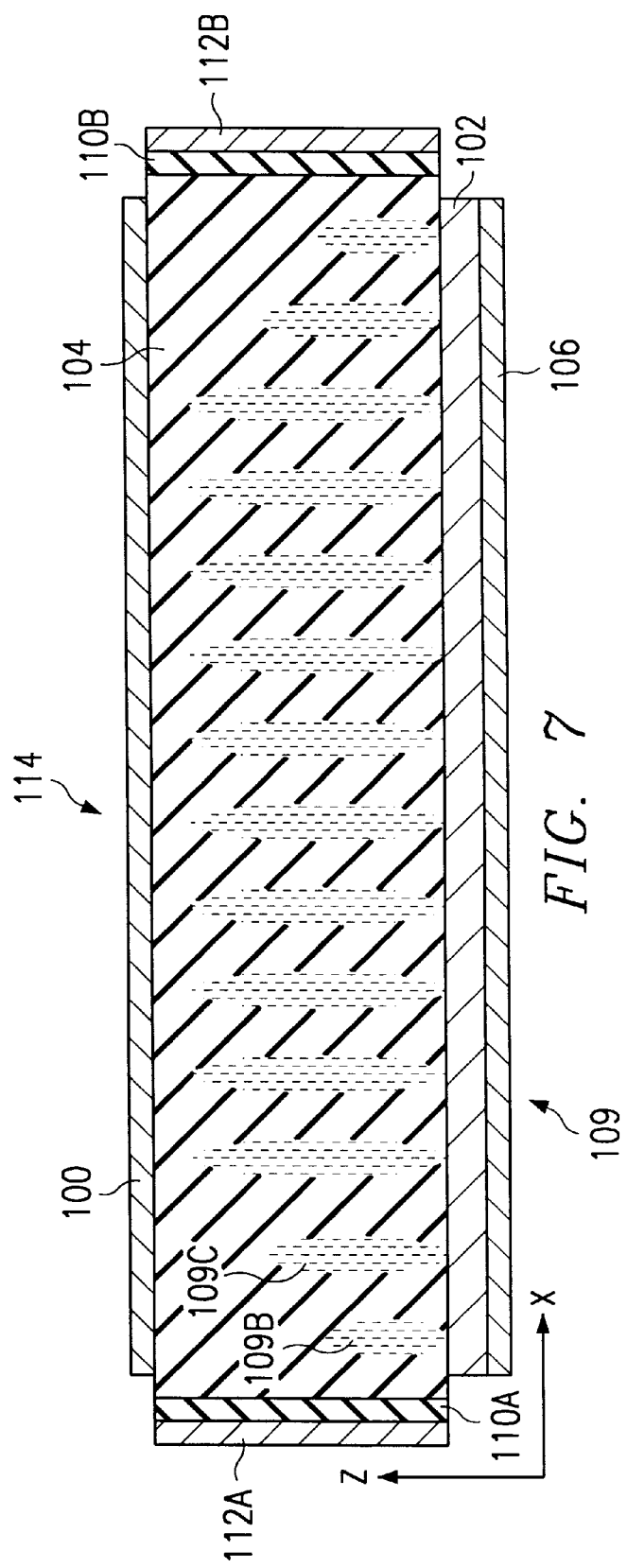
FIG. 7 is a section view showing improper placement of the insulating and conducting layers on the perimeter of an EQWIP photodetector.

Placement of highly conducting layers 112A and 112B at a maximum in a standing wave electric field 109 is shown in sectional view FIG. 7 of an EQWIP photodetector 114. As stated previously, highly conducting layers will not support electric fields with large field components tangential to the highly conducting layers, thus disrupting the standing electric field 109.

Reduced high field regions adjacent to the conducting layers 112A and 112B are clearly evident in FIG. 7. Insulating layers 110A and 110B are provided on the interior of the conducting layers 112A and 112B. The conducting layers 112A and 112B cause the standing electric field 109 to destructively interfere with itself at the boundary. High field regions 109B and 109C have reduced magnitude and/or volume relative to the case shown in FIG. 6. This improper placement of the insulating layers 110A and 110B and the conducting layers 112A and 112B reduces the QE of the EQWIP photodetector lowering signal currents and decreasing sensitivity.

While this Detailed Description elaborates upon embodiments of the invention as it relates specifically to QWIP-based IR photodetectors, this is not meant to limit application of the invention. Alternative embodiments may incorporate different configurations, substitutions, and modifications without departing from the scope of the invention.

What is claimed is:

1. An electromagnetic radiation sensor, in which incident radiation is diffracted, comprising:
    a radiation absorbing structure for absorbing said diffracted radiation,
    a resonant cavity for said radiation, said radiation absorbing structure positioned in said cavity,
    a reflector for said radiation, said reflector defining one surface of said cavity,
    electrical conductors in contact with said radiation absorbing structure for carrying a detection signal produced by said radiation absorbing structure in response to said radiation, and
    a conductive layer encompassing the periphery of said cavity for providing an electrical field boundary for said radiation in said cavity.

2. An electromagnetic radiation sensor as recited in claim 1 including an insulating layer on the inner surface of said peripheral conductive layer.

3. An electromagnetic radiation sensor as recited in claim 1 wherein said radiation absorbing structure is a diffraction grating.

4. An electromagnetic radiation sensor as recited in claim 1 wherein said electrical conductors are positioned on opposite sides of said radiation absorbing structure.

5. An electromagnetic radiation sensor as recited in claim 1 wherein said radiation absorbing structure is a quantum well infrared photodetector.

6. An electromagnetic radiation sensor as recited in claim 1 wherein said reflector is planar.

7. An electromagnetic radiation sensor, in which incident radiation is diffracted, comprising:
    a quantum well infrared photodetector for absorbing said diffracted radiation,
    a resonant cavity for said radiation, said quantum well infrared photodetector positioned in said cavity,
    a reflector for said radiation, said reflector defining one surface of said cavity,
    electrical conductors in contact with said quantum well infrared photodetector for carrying a detection signal produced by said quantum well infrared photodetector in response to said radiation,
    an insulative layer encompassing the periphery of said cavity, and
    a conductive layer on the outer surface of said peripheral insulative layer for providing an electrical field boundary for said radiation in said cavity.

8. An electromagnetic radiation sensor as recited in claim 7 wherein said electrical conductors are positioned on opposite sides of said quantum well infrared photodetector.

9. An electromagnetic radiation sensor as recited in claim 7 wherein said reflector is planar.

10. An electromagnetic radiation sensor as recited in claim 7 wherein one of said electrical conductors is a diffraction grating.

11. An electromagnetic radiation sensor as recited in claim 7 wherein said quantum well infrared photodetector is a diffraction grating.

12. An electromagnetic radiation sensor as recited in claim 7 wherein said reflector is on the outer surface of one of said electrical conductors.

13. An electromagnetic radiation sensor, in which incident radiation is diffracted, comprising:
    a quantum well infrared photodetector for absorbing said diffracted radiation,
    a resonant cavity for said radiation, said quantum well infrared photodetector positioned in said cavity,
    a reflector for said radiation, said reflector defining one surface of said cavity,
    electrical conductors in contact with said quantum well infrared photodetector for carrying a detection signal produced by said quantum well infrared photodetector in response to said radiation, said electrical conductors positioned on opposite sides of said quantum well infrared photodetector,
    an insulative layer encompassing the periphery of said cavity, and
    a conductive layer on the outer surface of said peripheral insulative layer for providing an electrical field boundary for said radiation in said cavity.

14. An electromagnetic radiation sensor as recited in claim 13 wherein said reflector is planar.

15. An electromagnetic radiation sensor as recited in claim 13 wherein one of said electrical conductors is a diffraction grating.

16. An electromagnetic radiation sensor as recited in claim 13 wherein said quantum well infrared photodetector is a diffraction grating.

17. An electromagnetic radiation sensor as recited in claim 13 wherein said reflector is on the outer surface of one of said electrical conductors.

18. An electromagnetic radiation sensor, in which incident radiation is diffracted, comprising:

a quantum well infrared photodetector for absorbing said diffracted radiation, a resonant cavity for said radiation, said quantum well infrared photodetector positioned in said cavity, electrical conductors in contact with said quantum well infrared photodetector for carrying a detection signal produced by said quantum well infrared photodetector in response to said radiation, said electrical conductors positioned on opposite sides of said quantum well infrared photodetector, one of said electrical conductors forming a diffraction grating, a planar reflector for said radiation, said reflector positioned on the outer surface of one of said electrical conductors not forming said diffraction grating, said reflector defining one surface of said cavity, an insulative layer encompassing the periphery of said cavity, and a conductive layer on the outer surface of said peripheral insulative layer for providing an electrical field boundary for said radiation in said cavity.

19. An electromagnetic radiation sensor, in which incident radiation is diffracted, comprising:

a quantum well infrared photodetector for absorbing said diffracted radiation, a resonant cavity for said radiation, said quantum well infrared photodetector positioned in said cavity, electrical conductors in contact with said quantum well infrared photodetector for carrying a detection signal produced by said quantum well infrared photodetector in response to said radiation, said electrical conductors positioned on opposite sides of said quantum well infrared photodetector, one of said electrical conductors forming a diffraction grating, a reflector for said radiation, said reflector positioned on the outer of surface said electrical conductor forming said diffraction grating, said reflector defining one surface of said cavity, an insulative layer encompassing the periphery of said cavity, and a conductive layer on the outer surface of said peripheral insulative layer for providing an electrical field boundary for said radiation in said cavity.

20. An electromagnetic radiation sensor, in which incident radiation is diffracted, comprising:

a quantum well infrared photodetector for absorbing said diffracted radiation, said quantum well infrared photodetector forming a diffraction grating, a resonant cavity for said radiation, said quantum well infrared photodetector positioned in said cavity, electrical conductors in contact with said quantum well infrared photodetector for carrying a detection signal produced by said quantum well infrared photodetector in response to said radiation, said electrical conductors positioned on opposite sides of said quantum well infrared photodetector, a planar reflector for said radiation, said reflector positioned on the outer surface of one of said electrical conductors, said reflector defining one surface of said cavity, an insulative layer encompassing the periphery of said cavity, and a conductive layer on the outer surface of said peripheral insulative layer for providing an electrical field boundary for said radiation in said cavity.

21. An electromagnetic radiation sensor array, the array including a plurality of sensor pixel structures, in which incident radiation is diffracted, comprising:

a radiation absorbing structure in each of said sensor pixel structures for absorbing said diffracted radiation, a resonant cavity in each of said sensor pixel structures for said radiation, said radiation absorbing structure positioned in said cavity, a reflector in each of said sensor pixel structures for said radiation, said reflector defining one surface of said cavity, electrical conductors in contact with said radiation absorbing structure in each of said sensor pixel structures for carrying a detection signal produced by said radiation absorbing structure in response to said radiation, and a conductive layer encompassing the periphery of said cavity in each of said sensor pixel structures for providing an electrical field boundary for said radiation in said cavity.

22. An electromagnetic radiation sensor array as recited in claim 21 including an insulating layer on the inner surface of said peripheral conductive layer in each of said sensor pixel structures.

23. An electromagnetic radiation sensor array as recited in claim 21 wherein said radiation absorbing structure in each of said sensor pixel structures is a diffraction grating.

24. An electromagnetic radiation sensor array as recited in claim 21 wherein said electrical conductors are positioned on opposite sides of said radiation absorbing structure in each of said sensor pixel structures.

25. An electromagnetic radiation sensor array as recited in claim 21 wherein said radiation absorbing structure in each of said sensor pixel structures is a quantum well infrared photodetector.

26. An electromagnetic radiation sensor array as recited in claim 21 wherein said reflector in each of said sensor pixel structures is planar.

27. An electromagnetic radiation sensor array, the array including a plurality of sensor pixel structures, in which incident radiation is diffracted, comprising:

a quantum well infrared photodetector in each of said sensor pixel structures for absorbing said diffracted radiation, a resonant cavity in each of said sensor pixel structures for said radiation, said quantum well infrared photodetector positioned in said cavity, a reflector in each of said sensor pixel structures for said radiation, said reflector defining one surface of said cavity, electrical conductors in contact with said quantum well infrared photodetector in each of said sensor pixel structures for carrying a detection signal produced by said quantum well infrared photodetector in response to said radiation, an insulative layer encompassing the periphery of said cavity in each of said sensor pixel structures, and a conductive layer on the outer surface of said peripheral insulative layer in each of said sensor pixel structures for providing an electrical field boundary for said radiation in said cavity.

28. An electromagnetic radiation sensor array as recited in claim 27 wherein said electrical conductors are positioned on opposite sides of said quantum well infrared photodetector in each of said sensor pixel structures.

29. An electromagnetic radiation sensor array as recited in claim 27 wherein said reflector in each of said sensor pixel structures is planar.

30. An electromagnetic radiation sensor array as recited in claim 27 wherein one of said electrical conductors in each of said sensor pixel structures is a diffraction grating.

31. An electromagnetic radiation sensor array as recited in claim 27 wherein said quantum well infrared photodetector in each of said sensor pixel structures is a diffraction grating.

32. An electromagnetic radiation sensor array as recited in claim 27 wherein said reflector is on the outer surface of one of said electrical conductors in each of said sensor pixel structures.

33. An electromagnetic radiation sensor array, the array including a plurality of sensor pixel structures, in which incident radiation is diffracted, comprising:

- a quantum well infrared photodetector in each of said sensor pixel structures for absorbing said diffracted radiation,
- a resonant cavity in each of said sensor pixel structures for said radiation, said quantum well infrared photodetector positioned in said cavity,
- a reflector in each of said sensor pixel structures for said radiation, said reflector defining one surface of said cavity,
- electrical conductors in contact with said quantum well infrared photodetector in each of said sensor pixel structures for carrying a detection signal produced by said quantum well infrared photodetector in response to said radiation, said electrical conductors positioned on opposite sides of said quantum well infrared photodetector,
- an insulative layer encompassing the periphery of said cavity in each of said sensor pixel structures, and
- a conductive layer on the outer surface of said peripheral insulative layer in each of said sensor pixel structures for providing an electrical field boundary for said radiation in said cavity.

34. An electromagnetic radiation sensor array as recited in claim 33 wherein said reflector in each of said sensor pixel structures is planar.

35. An electromagnetic radiation sensor array as recited in claim 33 wherein one of said electrical conductors in each of said sensor pixel structures is a diffraction grating.

36. An electromagnetic radiation sensor array as recited in claim 33 wherein said quantum well infrared photodetector in each of said sensor pixel structures is a diffraction grating.

37. An electromagnetic radiation sensor array as recited in claim 33 wherein said reflector in each of said sensor pixel structures is on the outer surface of one of said electrical conductors.

38. An electromagnetic radiation sensor array, the array including a plurality of sensor pixel structures, in which incident radiation is diffracted, comprising:

- a quantum well infrared photodetector in each of said sensor pixel structures for absorbing said diffracted radiation,
- a resonant cavity in each of said sensor pixel structures for said radiation, said quantum well infrared photodetector positioned in said cavity,
- electrical conductors in contact with said quantum well infrared photodetector in each of said sensor pixel structures for carrying a detection signal produced by said quantum well infrared photodetector in response to said radiation, said electrical conductors positioned on opposite sides of said quantum well infrared photodetector, one of said electrical conductors forming a diffraction grating in each of said sensor pixel structures,
- a planar reflector in each of said sensor pixel structures for said radiation, said reflector positioned on the outer surface of one of said electrical conductors not forming said diffraction grating, said reflector defining one surface of said cavity,
- an insulative layer encompassing the periphery of said cavity in each of said sensor pixel structures, and
- a conductive layer on the outer surface of said peripheral insulative layer in each of said sensor pixel structures for providing an electrical field boundary for said radiation in said cavity.

39. An electromagnetic radiation sensor array, the array including a plurality of sensor pixel structures, in which incident radiation is diffracted, comprising:

- a quantum well infrared photodetector in each of said sensor pixel structures for absorbing said diffracted radiation,
- a resonant cavity in each of said sensor pixel structures for said radiation, said quantum well infrared photodetector positioned in said cavity,
- electrical conductors in contact with said quantum well infrared photodetector in each of said sensor pixel structures for carrying a detection signal produced by said quantum well infrared photodetector in response to said radiation, said electrical conductors positioned on opposite sides of said quantum well infrared photodetector, one of said electrical conductors in each of said sensor pixel structures forming a diffraction grating,
- a reflector in each of said sensor pixel structures for said radiation, said reflector positioned on the outer surface of said electrical conductor forming said diffraction grating, said reflector defining one surface of said cavity,
- an insulative layer encompassing the periphery of said cavity in each of said sensor pixel structures, and
- a conductive layer on the outer surface of said peripheral insulative layer in each of said sensor pixel structures for providing an electrical field boundary for said radiation in said cavity.

40. An electromagnetic radiation sensor array, the array including a plurality of sensor pixel structures, in which incident radiation is diffracted, comprising:

- a quantum well infrared photodetector in each of said sensor pixel structures for absorbing said diffracted radiation, said quantum well infrared photodetector forming a diffraction grating,
- a resonant cavity in each of said sensor pixel structures for said radiation, said quantum well infrared photodetector positioned in said cavity,
- electrical conductors in contact with said quantum well infrared photodetector in each of said sensor pixel structures for carrying a detection signal produced by said quantum well infrared photodetector in response to said radiation, said electrical conductors positioned on opposite sides of said quantum well infrared photodetector,
- a planar reflector in each of said sensor pixel structures for said radiation, said reflector positioned on the outer surface of one of said electrical conductors, said reflector defining one surface of said cavity,
- an insulative layer encompassing the periphery of said cavity in each of said sensor pixel structures, and
- a conductive layer on the outer surface of said peripheral insulative layer in each of said sensor pixel structures for providing an electrical field boundary for said radiation in said cavity.

* * * * *